United States Patent
Jasinski

(10) Patent No.: US 7,355,186 B2
(45) Date of Patent: Apr. 8, 2008

(54) CHARGED PARTICLE BEAM DEVICE WITH CLEANING UNIT AND METHOD OF OPERATION THEREOF

(75) Inventor: Thomas Jasinski, Munich (DE)

(73) Assignee: ICT, Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 13 days.

(21) Appl. No.: 10/547,865

(22) PCT Filed: Mar. 3, 2004

(86) PCT No.: PCT/EP2004/002140

§ 371 (c)(1),
(2), (4) Date: May 24, 2006

(87) PCT Pub. No.: WO2004/079770

PCT Pub. Date: Sep. 16, 2004

(65) Prior Publication Data

US 2006/0231772 A1    Oct. 19, 2006

(30) Foreign Application Priority Data

Mar. 3, 2003    (EP) .................................. 03004665

(51) Int. Cl.
*G21G 5/00*    (2006.01)
*A61N 5/00*    (2006.01)

(52) U.S. Cl. ............... 250/431; 250/423 F; 250/432 R; 313/310; 313/341; 313/343; 313/346; 445/59

(58) Field of Classification Search ............... 250/431, 250/423 F; 313/310
See application file for complete search history.

(56) References Cited

U.S. PATENT DOCUMENTS

| | | | | |
|---|---|---|---|---|
| 4,090,106 A | * | 5/1978 | Okumura et al. | 315/107 |
| 4,242,194 A | * | 12/1980 | Steiner et al. | 204/645 |
| 5,189,341 A | | 2/1993 | Itoh et al. | |
| 5,399,865 A | * | 3/1995 | Umemura et al. | 250/423 F |
| 5,401,974 A | * | 3/1995 | Oae et al. | 250/492.2 |
| 5,587,720 A | * | 12/1996 | Fukuta et al. | 345/75.2 |
| 5,917,186 A | * | 6/1999 | Fujii et al. | 250/309 |
| 5,961,362 A | * | 10/1999 | Chalamala et al. | 445/59 |
| 5,969,467 A | * | 10/1999 | Matsuno | 313/309 |

(Continued)

FOREIGN PATENT DOCUMENTS

EP    0541394 A    5/1993

(Continued)

*Primary Examiner*—Jack I. Berman
*Assistant Examiner*—Bernard Souw
(74) *Attorney, Agent, or Firm*—Patterson & Sheridan, LLP

(57) ABSTRACT

The invention provides a charged particle beam device, an emitter module for emitting charged particle beams and a method of operation thereof. Thereby, a charged particle beam emitter (15) emitting charged particles along an optical axis (1) is realized. On the same carrier body (32), a cleaning emitter (16) for emitting charged particles approximately along the optical axis (1) is realized. Thus, an improved cleaning can be provided.

15 Claims, 4 Drawing Sheets

U.S. PATENT DOCUMENTS

| | | | |
|---|---|---|---|
| 5,993,636 A * | 11/1999 | Terui et al. | 205/640 |
| 5,994,833 A * | 11/1999 | Seko et al. | 313/495 |
| 6,364,730 B1 * | 4/2002 | Jaskie et al. | 445/24 |
| 6,427,703 B1 * | 8/2002 | Somekh | 134/1.1 |
| 6,545,274 B1 * | 4/2003 | Morita | 250/307 |
| 7,138,629 B2 * | 11/2006 | Noji et al. | 250/311 |
| 2002/0084426 A1 * | 7/2002 | Gerlach et al. | 250/492.1 |
| 2002/0102753 A1 * | 8/2002 | Johnson et al. | 438/20 |
| 2005/0045821 A1 * | 3/2005 | Noji et al. | 250/311 |
| 2006/0169900 A1 * | 8/2006 | Noji et al. | 250/310 |
| 2006/0231772 A1 * | 10/2006 | Jasinski | 250/492.1 |
| 2007/0158588 A1 * | 7/2007 | Zhou et al. | 250/492.2 |

FOREIGN PATENT DOCUMENTS

| | | |
|---|---|---|
| JP | 55001016 A | 1/1980 |
| JP | 55033719 A | 3/1980 |

* cited by examiner

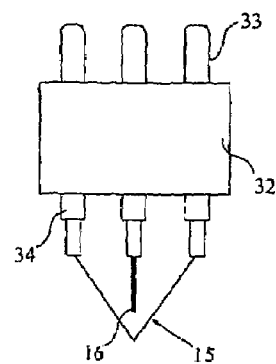
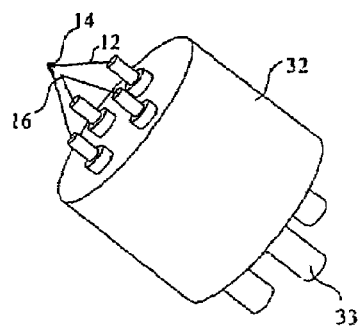
Fig. 3a
Fig. 3b
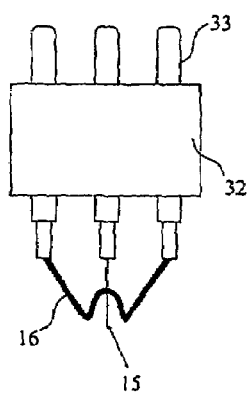
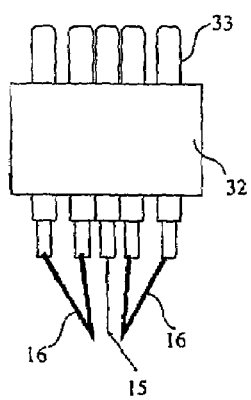
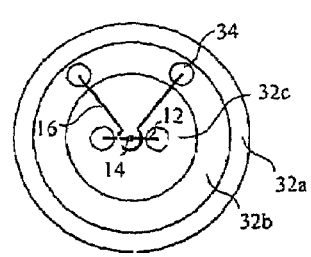
Fig. 3c
Fig. 3d
Fig. 3e

CHARGED PARTICLE BEAM DEVICE WITH CLEANING UNIT AND METHOD OF OPERATION THEREOF

FIELD OF THE INVENTION

The invention relates to a charged particle beam device for inspection system applications, testing system applications, lithography system applications, electron microscopes and the like. It also relates to methods of operation thereof. Further, the present invention relates to a charged particle beam device with a cleaning system. Specifically, it relates to an emitter module, a charged particle beam device and a method of cleaning and operating a charged particle beam device.

BACKGROUND OF THE INVENTION

Charged particle beam apparatuses are used in a plurality of industrial fields. Inspection of semiconductor devices during manufacturing, exposure systems for lithography, detecting devices and testing systems are only some of these fields.

In general, there is a high demand for structuring and inspecting specimens within the micrometer or nanometer scale. On such a small scale, process control, inspection or structuring is often done with charged particle beams, e.g. electron beams, which are generated and focused in charged particle beam devices such as electron microscopes or electron beam pattern generators. Charged particle beams offer superior spatial resolution compared to, e.g. photon beams due to their short wavelengths.

Generally, charged particle beam devices are operated under vacuum conditions to avoid, e.g. ionization of surrounding gases. In spite of that, electrons impinging on component surfaces of the device, like extractors, anodes, apertures or the chamber wall result in an emission of contaminants. Thus, a shower of residual gas is generated. The residual gas contains molecules which can be hit by electrons. Thereby, ions, ionized molecules and other particles can be created. In the case of ions and ionized molecules having a charge which is opposite to the charge of the charged particles emitted by an emitter, the ions and ionized molecules in the residual gas are accelerated towards the emitter. As a result, the emitter can be mechanically deformed from the impingement of the ions and ionized molecules or these particles can be deposited on the emitter. Thus, emitter noise is introduced.

According to a known solution, a pretreatment is conducted. A respective apparatus, shown in FIG. 4, will be described in the following. In FIG. 4, an emitting unit comprising a wire 12 and a field emitter 14 is shown. If high voltages are applied between the emitter and the extractor 8, the field emitter emits charged particles, e.g. electrons along optical axis 1. Further, an anode 6 and aperture 7 are provided. These devices are used to avoid a widespread emission, an acceleration of the charged particles and a beam shaping. Further, condenser lens 4 can be used to image the electron source or a beam crossover acting as a virtual electron source.

Before operating the charged particle beam device, it has to be evacuated. After a certain vacuum level has been reached, an electron gun 42 with a high current floods the chamber with electrons. The emitted electrons impinging on the walls or other surfaces of parts of the column and additional heat detach volatile molecules from the surfaces of the column. Thereby, residual gas is created. The residual gas gets pumped out of the chamber by vacuum pumps.

As a result, within this cleaning step, residual gas in the form of molecules attached to column surfaces gets pumped out of the column before the intended use of the charged particle device starts. On the one hand, ions created during the cleaning step do not damage field emitter 14 and are hardly deposited thereon. On the other hand, the molecules and ions possibly damaging the field emitter during intended use are pumped out of the chamber.

However, the known solution is still not satisfactory.

SUMMARY OF THE INVENTION

The present invention intends to provide an improved charged particle beam device. Therefore, an improved cleaning of the chamber is provided. According to aspects of the present invention, an emitter module according to independent claim 1, a charged particle beam device according to independent claim 8 and a method of cleaning and operating a charged particle beam decide according to independent claim 9 are provided.

According to one aspect, an emitter module for emitting charged particle beams is provided. The emitter module comprises a carrier body insulating high voltage feedthroughs from the surrounding. The emitter further comprises a charged particle beam emitter for emitting charged particles along an optical axis and a cleaning emitter for emitting charged particles approximately along the same optical axis.

Thus, the space for a separate cleaning emitter holder and electrical feedthrough can be avoided. Beyond the easy and small integration of a cleaning emitter, the cleaning is especially conducted on relevant surfaces, since the cleaning emission takes the same path through the column. Additionally, the emitter for intended use can be cleaned and a column alignment might be conducted making use of the cleaning emitter.

According to a farther aspect, the cleaning emitter is a thermionic electron emitter, optionally with a thickness of 50 µm to 500 µm. The cleaning emitter is further optionally made of tungsten or a tungsten wire.

Thus, high currents up to the mA range can be provided during cleaning. Thereby, the cleaning process is speeded up.

The aspects mentioned above can, even though not limited thereto, be valuable for charged particle beam devices with field emitters for the intended use.

The residual gas, which causes problems particularly with the high electric fields due to high potentials and the small radius of curvature of the emitter tip, is reduced, since an improved cleaning has been conducted before.

According to a further aspect, a charged particle beam device making use of the above described aspects of emitter modules is provided. Therefore, beam shaping means, like apertures, stigmators or the like; guiding means, like extractors, deflection stages or the like; scanning means; and/or focusing means like condenser lenses and/or objective lenses or the like might be used in the charged particle beam device.

According to a further aspect, a method for using a charged particle device is provided. Thereby, charged particles are emitted approximately along an optical axis with a cleaning emitter. Further, molecules, atoms and ions are pumped out of a chamber of the charged particle device. During intended use, charged particles are emitted along the same optical axis with a charged particle emitter.

According to a further aspect, the vacuum within the charged particle device is monitored and the intended use is started depending on the vacuum pressure.

According to a further aspect, different methods of applying voltages during cleaning and intended use are realized. Therefore, during cleaning, the charged particle beam emitter (for intended use) is not biased during cleaning and is biased during intended use. Further, during cleaning, components influencing the beam shape and the charged particle acceleration can either be used similarly to the intended use or can be used such that an increased amount of surfaces as compared to the intended use is hit by electrons during cleaning.

The invention is also directed to an apparatus for carrying out the disclosed methods, including apparatus parts for performing each of the described method steps. These method steps may be performed by way of hardware components, a computer programmed by appropriate software, by any combination of the two or in any other manner. Furthermore, the invention is also directed to methods by which the described apparatus operates or is manufactured. It includes method steps for carrying out every function of the apparatus.

BRIEF DESCRIPTION OF THE DRAWINGS

Some of the above indicated and other more detailed aspects of the invention will be described in the following description and partially illustrated with reference to the figures. As used herein, like numerals throughout the various figures represent the same or equivalent features of the present invention. Therein:

FIG. 3a shows a schematic side view of an embodiment of an emitter cleaning filament module according to the invention;

FIG. 3b shows a schematic perspective view of FIG. 3a;

FIGS. 3c to 3e show schematic views of further embodiments of cleaning emitters filament modules.

DETAILED DESCRIPTION OF THE DRAWINGS

Without limiting the scope of protection of the present application, in the following the charged particle beam device will exemplarily be referred to as an electron beam device. The present invention can still be applied for apparatuses using other sources of charged particles.

Figure 1:
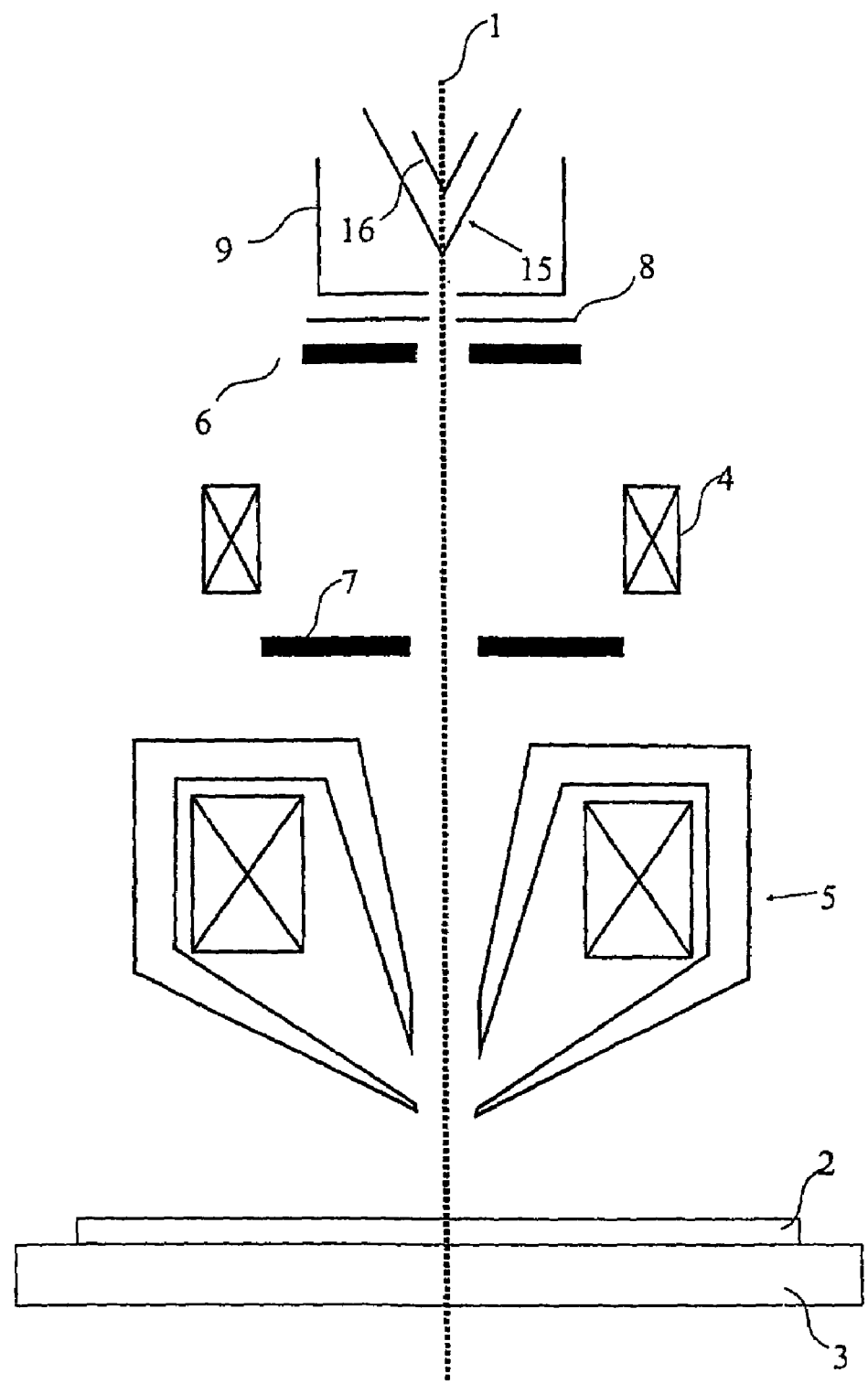
FIG. 1 shows a schematic side view of a charged particle beam device making use of one or more embodiments of the present invention.

FIG. 1 shows one embodiment according to the present invention. Generally, electron beam devices are operated under vacuum conditions. Therefore, a vacuum pump is connected to a port of each chamber of the device. Accordingly, gas molecules, which could be ionized by the electron beam, are pumped out of the device. Without limiting the scope of the invention to systems with several chambers, commonly, the device is subdivided into different chambers. For example, the vacuum required for operation of an electron gun has a lower pressure than the vacuum required close to a specimen. Thus, it is common to provide at least a gun chamber, a chamber for other beam guiding means in the column and a specimen chamber. The vacuum pumps are operated most of the time to pump molecules, which get into one of the chambers during assembly of the electron beam device, during maintenance, through leaks or through introduction of a new specimen, out of the chamber. Before the intended use of the device starts, the chambers have to be pumped down to a determined pressure level.

During intended use, e.g. inspection, imaging, testing or patterning of specimen 2, electron beam emitter 15 emits an electron beam along optical axis 1. The term "intended use" is to be understood as conducting measurements or patterning for, e.g. inspection, imaging, testing, patterning for lithography or the like, whatever purpose the electron beam device has. On the other hand, the present invention refers to cleaning steps, alignment steps, calibration steps or the like as maintenance operations.

The emitted electron beam is further guided with the following components. The electrons are extracted by a first extraction electrode and accelerated along the optical axis 1 towards the specimen. A first electrostatic condenser 4 might be used to focus the electron beam. With thermal emitters, a Wehnelt grid 9 (or Wehnelt cylinder) might be used, which is biased to a slightly more negative potential than the emitter itself. Thus, electrons do not move in arbitrary directions as compared to the optical axis. Instead, the electrons move along the optical axis and are focused. Extractor 8 and anode 6 have e.g. a potential of 3 kV with respect to the emitter. Accordingly, electrons of the electron beam emitter are accelerated towards specimen 2. Condenser lens 4 and aperture 7 are used to further shape the electron beam. Additionally, depending on the strength of the focusing field of condenser 4, more or less of the electron beam is suppressed by aperture 7. Thus, the beam current applied to the specimen can be adjusted with the strength of the focusing field of the condenser.

Objective lens 5 focuses the electron beam on specimen 2. As such, an electron beam spot of a few nanometers can be achieved. This beam spot can either be used to image the specimen or write a pattern thereon. Additional components (not shown) for deflecting the beam, adjusting the beam position relative to optical axis 1 or scanning the beam over an area of the specimen can be used. Further, the specimen, which is located on specimen stage 3, can be moved two-dimensionally in relation to the optical axis by moving the specimen stage.

However, as described within the "background of the invention", electrons impinging on any components like a Wehnelt grid, extractor 8, anode 6 or the like cause the release of molecules from the surfaces hit by the electrons. As a result, a shower of residual gas is created. This residual gas can be ionized by the electron beam. Positively charged ions of the ionized residual gas are accelerated towards emitter 15. The ions, accelerated to high energies, can either be deposited on the electron beam emitter or mechanically deform the emitter. The electron beam current is influenced by these ions and current noise and/or damage of the emitter occurs.

Thus, before the intended use described above, a pretreatment of the electron beam device is required. Accordingly, cleaning emitter 16 is used to produce electrons. These electrons also impinge on the surfaces of Wehnelt cylinder 9, extractor 8, anode 6 and other components. The residual gas created can be pumped out of the device with vacuum pumps. In contrast to the intended use, electron beam emitter 15 is not negatively biased during the cleaning operation. Thus, ions from the ionized residual gas are not accelerated directly towards electron beam emitter 15.

Figure 4:
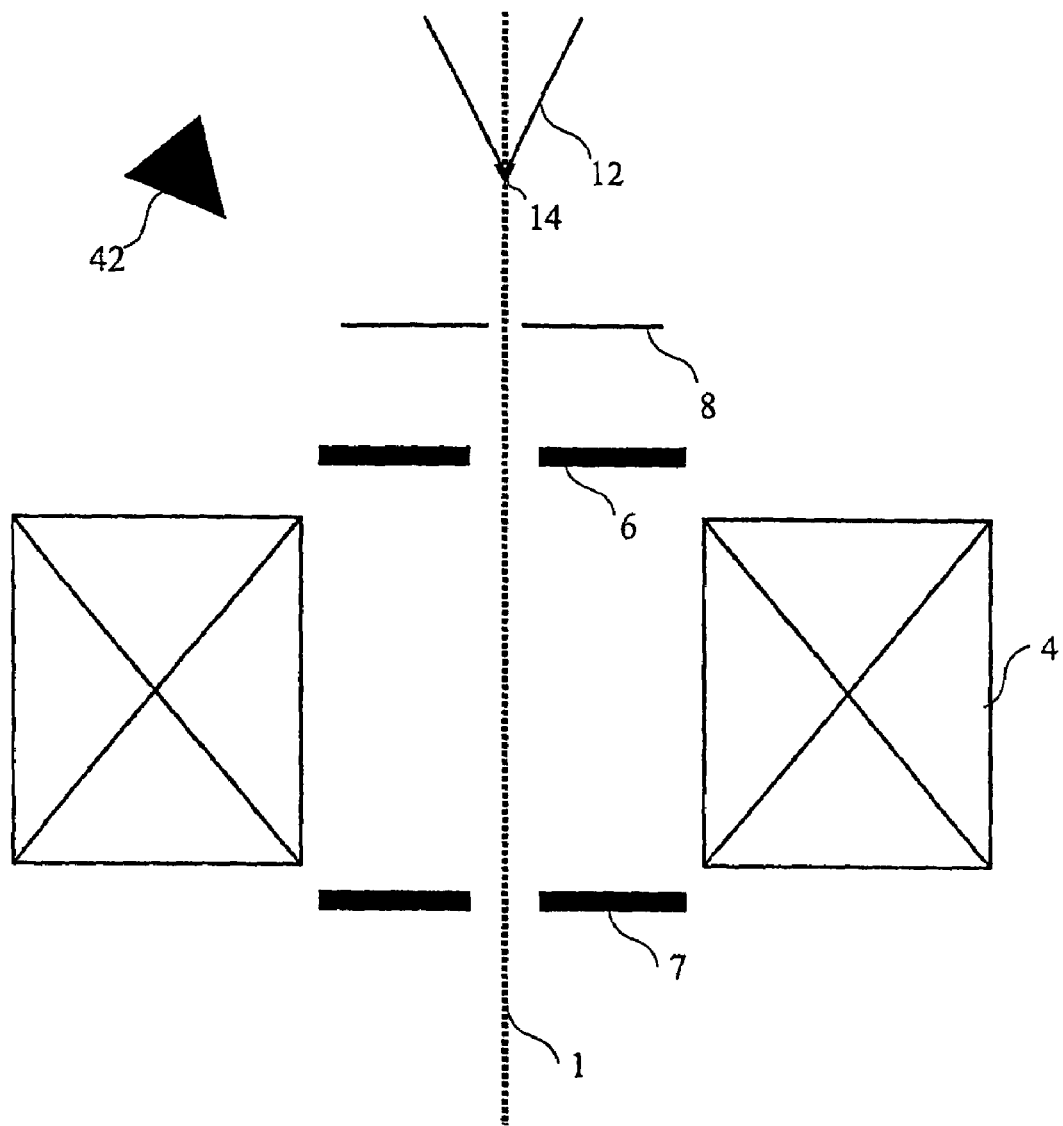
FIG. 4 shows a schematic side view of an embodiment of an electron beam device with a cleaning emitter.

Compared to the known solution previously described with respect to FIG. 4, cleaning emitter 16 does not require extra space within the device. Additionally, electrons, which are emitted by the cleaning emitter to clean the surfaces, do travel approximately along optical axis 1. In this manner, the surfaces, which might be hit by the electron beam during the intended use, are cleaned. Thus, the cleaning step concentrates on the surfaces relevant for the intended use.

Figure 2:
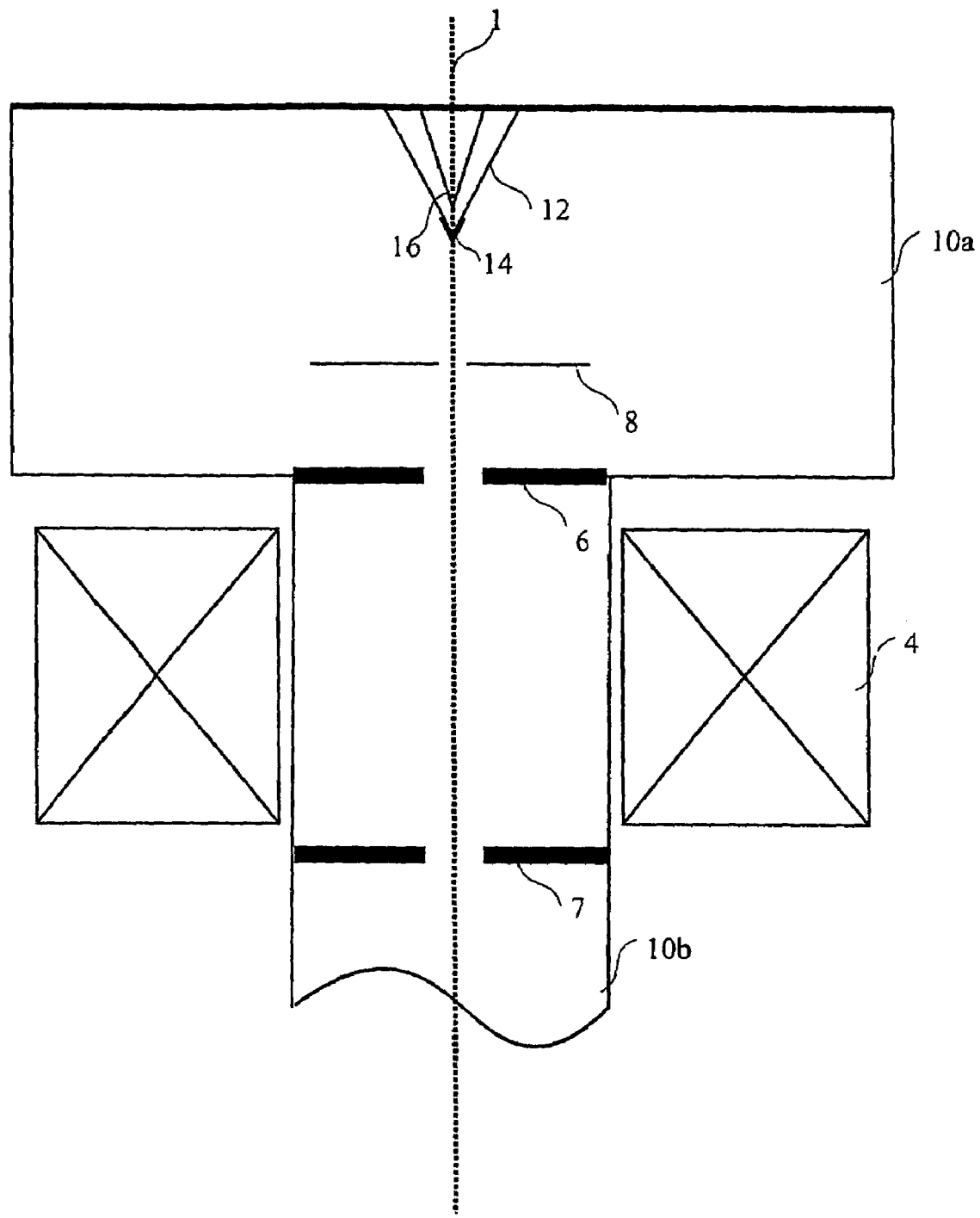
FIG. 2 shows a schematic side view of an embodiment of an electron beam device according to the invention.

This is explained in more detail with respect to FIG. 2. Within FIG. 2, two chambers of the electron beam device are shown, that is, the gun chamber 10*a*, and a further chamber 10*b*. In the case where an electron gun 42 (see FIG. 4) would be used, only a view of the components that might be hit by electrons during the intended use would be cleaned. If electron gun 42 was located similarly to FIG. 4, e.g., the upper side of extractor 8 and aperture 7 would not be cleaned by direct impingement of electrons. Further, cleaning of components outside of gun chamber 10*a* is more difficult. The surfaces of extractor 8, anode 6, aperture 7 and the like are particularly critical concerning the creation of residual gas during the intended use.

Thus, positioning the cleaning emitter approximately on the optical axis makes cleaning of all relevant surfaces possible. Thereby, the term approximately is to be understood as positioning the cleaning emitter substantially on optical axis 1. Small lateral displacements from the optical axis preferably below 2 mm, even more preferably below 0.5 mm are used.

The position of cleaning emitter 16 in FIGS. 1 and 2 is above electron beam emitter 15. Thus, from a perspective of the specimen towards the emitters, the cleaning emitter is located behind the electron beam emitter for the intended use. Further, from a perspective of the electron beam emitter 15 (12+14) towards the specimen, cleaning emitter 16 would be located behind the electron beam emitter. Thus, the expression "cleaning emitter 16 is located behind electron beam emitter 15" is to be understood such that the two emitters are positioned with respect to each other approximately along one axis, whereby an electron beam emitted towards the specimen during the intended use does not need to pass the other emitter, whereas electrons emitted towards the specimen during cleaning have to pass the other emitter. However, as described with respect to FIGS. 3*c* and 3*d*, other arrangements of emitters can be used.

As already describe above, before the intended use, a cleaning step making use of cleaning emitter 16 is conducted. This is not to be understood as conducting the cleaning step before every measurement or patterning operation, but as conducting the cleaning step e.g. once after assembly, after maintenance or after any operation that could introduce contamination to the interior of the device before the intended use starts. Additionally, the cleaning step could be used on a regular basis, e.g. every 100 to 1000 measurements, before the regular use starts. Thus, the cleaning step is only required before the intended use in the case where the surfaces hit by the electron beam during intended use are contaminated with molecules, atoms, ions or the like. However, according to a different usage of the cleaning emitter, the cleaning process can be in operation all the time. Alternatively, the cleaning process can only be disabled during the intended use of the charged particle device. Thus, an improved cleanness can be achieved. In case the cleaning is disabled during the intended use, acceleration of ions or ionized molecules from the residual gas towards e.g. a field emitter tip can be avoided.

As already described above, within the cleaning step, cleaning emitter 16 emits electrons which impinge on the surfaces of the electron beam device, namely, the Wehnelt grid 9, the extractor 8, anode 6, parts of the housing or the like. Accordingly, a shower of residual gas is released from the respective surfaces. This residual gas is then pumped out of the gun chamber 10*a*, chamber 10*b* or other chambers of the device.

As shown in FIG. 2, the electron beam emitter (12+14) for intended use is a field emitter comprising wire 12 and field emitter tip 14. Generally, field emitter tip 14 is welded to wire 12. For field emission, a high potential is applied to the field emitter. Due to the small radius of curvature of the emitter tip, high electrical fields are obtained. Therefore, electrons can escape from the emitter tip surface. However, these high electrical fields would also act on ionized atoms or molecules, in the case of an insufficient cleaning of the chamber. Due to the small radius of curvature, the ionized atoms and molecules would be focused on the field emitter tip. Thus, the presented cleaning embodiment and the method of operating thereof is especially valuable for field emitters. During the operation of cleaning emitter 16, field emitter (12+14) does not need to be biased. Thus, there is no focusing force towards emitter tip 14 acting on the ionized atoms and molecules. However, the present invention is not limited to the usage of the cleaning unit for devices with field emitters.

A further aspect to be considered refers to the biasing of the components that are surrounding the emitters. According to one usage of the cleaning unit, the emitter, the Wehnelt grid 9, the extractor 8 and the aperture 6 are biased such that electrons from the cleaning emitter are accelerated less, as compared to the intended use. Thereby, an acceleration of ionized atoms and molecules is also reduced. Thus, damage introduced by the ionized atoms and molecules during the cleaning operation can be reduced. In view of the above, the usage of a thermionic emitter as a cleaning emitter might be advantageous, since a thermionic emitter can be biased to voltages about one magnitude below the voltages required for field emitters.

However, according to another usage of the cleaning unit, the respective components are biased similarly as compared to the conditions during intended use. Thereby, the electrons of cleaning emitter 16 are guided through the column on substantially the same path and with essentially the same beam shape as the electron beam during the intended use, since the voltages applied to the respective components influence the electron beam path and the electron beam shape. Thus, applying similar voltages and/or control signals to the respective components increases the cleaning of those surfaces that are hit by electrons during the intended use. Thus, it can also be advantageous if the cleaning emitter is biased to voltages, which are comparable to the voltage of a field emitter 14 applied during intended use.

On the one hand, the two usages described above can be chosen depending on the needs for best intended use. On the other hand, the two usages relating to the voltages applied to the respective components can be combined such that first a cleaning of a large surface area is conducted and afterwards a cleaning of the surfaces most relevant for the intended use is conducted.

An embodiment of an electron emitter-cleaning filament module is described with respect to FIGS. 3*a* and 3*b*. FIG. 3*a* shows a side view of an emitter module. The emitter module comprises a carrier body 32. The carrier body comprises insulating material to provide an insulation for the feedthrough 34 of the high voltage wires. The high voltage for the electron beam emitter 15 and the cleaning emitter 16 is applied to contact pins 33. These contact pins are connected to wire 12 of the electron beam emitter 15 and to the filament of cleaning emitter 16. As shown in FIG. 3*b*, the electron beam emitter 15 for the intended use is a field emitter with field emitter tip 14 connected to wire 12. Cleaning emitter 16 is a thermionic emitter made of tungsten, Lanthanum Hexaboride or the like. Thereby, high currents can be achieved. Therefore, a tungsten filament has a thickness of at least 50 µm. The filament thickness can be between 50 µm and 500 µm. Preferably, it is between 100 µm and 200 µm. Thus, the filament is strong enough to allow heating to high temperatures as compared to other usages of tungsten filaments. The high currents achieved therefore enable a fast cleaning.

As can be seen from FIG. 3b, the tip of filament 16 and the field emitter tip 14 are positioned closely together. Accordingly, the aspect of cleaning essentially the same surfaces during the cleaning process as compared to the surfaces hit by electrons during intended use can be further improved. However, the heat emitted by filament 16 during cleaning has to be considered. Since field emitter tip 14 is generally welded to wire 12, the exposure to heat might damage this connection. Thus, the distance between the tip of cleaning filament 16 and the field emitter tip 14 should be between 200 µm and 5 mm and is preferably between 500 µm and 2 mm.

Further embodiments of cleaning emitter modules are described with respect to FIGS. 3c to 3e. FIG. 3c shows an embodiment comparable to FIG. 3a. However, the tungsten wire of cleaning emitter 16 is formed such that two tips adjacent to electron beam emitter 15 are formed. Thus, in contrast to the embodiment of FIG. 3a, the cleaning electrons are not emitted behind electron beam emitter 15, but are emitted next to the electron beam emitter. In spite of the different geometry, all aspects relating to distances between the two emitters and to distances between the optical axis and the cleaning emitters remain valid.

The same applies for the embodiment shown in FIG. 3d. Therein, two cleaning emitters 16 are provided. Comparable to FIG. 3c, the cleaning emitters 16 are located next to electron beam emitter 15. In contrast to FIG. 3c, the two cleaning emitters are biased via separate wires.

A further embodiment is shown in FIG. 3e. Therein, two modifications as compared to the previous embodiments are illustrated. These modifications, namely the construction of carrier body and the arrangement of cleaning emitter 16, can be combined independent of each other with other embodiments described within the application.

In FIG. 3e, carrier body 32 comprises three components 32a, 32b and 32c. However, these components are arranged such that they form one carrier body, which can e.g. during maintenance of an electron beam device be replaced in one piece. Thus, according to the present invention, the carrier body can be made of a single piece unit with feed throughs 34 for the emitter wire, can be made of several pieces with feed throughs or can be made of several pieces with feed throughs at the intersection of the several pieces.

In FIG. 3e, cleaning emitter 16 is provided in the form of a ring around field emitter tip 14. Thus, cleaning electrons can be emitted over a wide area in the vicinity of the optical axis. Thus, many cleaning electrons can be provided close to the optical axis. The radius of the cleaning emitter ring can be in the range of 100 µm to 2 mm and is preferably between 200 µm and 0.5 mm.

The terms and expressions which have been employed herein are used as terms of description and not of limitation, and there is no intention, in the use of such terms and expressions, of excluding any equivalents of the features shown and described or portions thereof. Having thus described the invention in detail, it should be apparent that various modifications can be made in the present invention without departing from the spirit and scope of the following claims.

Generally, providing a cleaning filament integrated in the same emitter module used for the charged particle emission during the intended use provides an improved cleaning over known solutions.

The invention claimed is:

1. An emitter module for emitting charged particle beams in a charged particle beam device having an optical axis and at least one component from the group consisting of: an extractor, an anode, a Wehnelt cylinder, an aperture, and a housing portion, comprising:
    a carrier body comprising an insulating material;
    a charged particle beam emitter emitting charged particles along the optical axis, wherein the charged particle emitter is mechanically connected to the carrier body; and
    a cleaning emitter for emitting charged particles approximately along the optical axis for cleaning a surface of the at least one component, wherein the cleaning emitter is mechanically connected to the carrier body.

2. The emitter module according to claim 1, wherein the carrier body comprises at least two components.

3. The emitter module according to claim 1, wherein any of the preceding claims, whereby the carrier body is arranged for a handling in one piece.

4. The emitter module according to claim 1, wherein the cleaning emitter is a thermionic electron emitter.

5. The emitter module according to claim 1, wherein a filament of the cleaning emitter has a thickness of 50 µm to 500 µm.

6. The emitter module according to claim 1, wherein the cleaning emitter is a tungsten emitter.

7. The emitter module according to claim 1, wherein the cleaning emitter is positioned behind the charged particle beam emitter.

8. The emitter module according to claim 1, wherein the charged particle beam emitter is a field emitter.

9. The emitter module according to claim 1, wherein the cleaning emitter and the charged particle beam emitter are fixedly mounted with respect to the optical axis.

10. A charged particle device for emitting charged particle beams and having an optical axis, comprising:
    at least one component from the group consisting of: an extractor, an anode, a Wehnelt cylinder, an aperture, and a housing portion;
    a beam shaping aperture;
    an emitting module having
        a carrier body comprising an insulating material;
        a charged particle beam emitter emitting charged particles along the optical axis, wherein the charged particle emitter is mechanically connected to the carrier body; and
        a cleaning emitter for emitting charged particles approximately along the optical axis for cleaning a surface of the at least one component or the beam shaping aperture, wherein the cleaning emitter is mechanically connected to the carrier body; and
    an objective lens for focusing the charged particle beam onto a specimen.

11. A method of cleaning and operating a charged particle device having an optical axis and at least one component from the group consisting of: an extractor, an anode, a Wehnelt cylinder, an aperture, and a housing portion, comprising:

a) emitting charged particles approximately along the optical axis with a cleaning emitter for cleaning a surface of the at least one component, wherein the cleaning emitter is located within a gun chamber of the charged particle device;

b) pumping molecules, atoms and ions out of the charged particle device; and c) emitting charged particles onto a specimen along the optical axis with a charged particle emitter, wherein the charged particle emitter is located within the gun chamber of the charged particle device.

12. The method according to claim 11, further comprising:

monitoring the vacuum pressure within the chamber; and starting step c) based on the vacuum pressure.

13. The method according to claim 11, wherein step a) further comprises heating a filament of the cleaning emitter.

14. The method according to claim 11, wherein step a) further comprises biasing an extractor and an anode.

15. The method according to claim 11, wherein step c) further comprises biasing a field emitter, the extractor and the anode.

* * * * *